United States Patent
Swaminathan

(10) Patent No.: US 7,260,760 B2
(45) Date of Patent: Aug. 21, 2007

(54) METHOD AND APPARATUS TO DISABLE COMPACTION OF TEST RESPONSES IN DETERMINISTIC TEST-SET EMBEDDING-BASED BIST

(75) Inventor: Shivakumar Swaminathan, Morrisville, NC (US)

(73) Assignee: International Business Machines Corporation, Armonk, NY (US)

( * ) Notice: Subject to any disclaimer, the term of this patent is extended or adjusted under 35 U.S.C. 154(b) by 132 days.

(21) Appl. No.: 11/115,606

(22) Filed: Apr. 27, 2005

(65) Prior Publication Data

US 2006/0248423 A1    Nov. 2, 2006

(51) Int. Cl.
*G01R 31/28* (2006.01)

(52) U.S. Cl. .......................... 714/738; 714/724; 714/32

(58) Field of Classification Search ................. None
See application file for complete search history.

(56) References Cited

U.S. PATENT DOCUMENTS

| | | | | |
|---|---|---|---|---|
| 4,519,078 | A | * | 5/1985 | Komonytsky ............... 714/728 |
| 4,910,735 | A | | 3/1990 | Yamashita .................. 371/22.4 |
| 5,301,199 | A | | 4/1994 | Ikenaga et al. ............ 371/22.5 |
| 5,574,733 | A | | 11/1996 | Kim ............................ 371/27 |
| 5,579,272 | A | | 11/1996 | Uchida ....................... 365/201 |
| 5,694,402 | A | | 12/1997 | Butler et al. ............... 371/22.4 |
| 6,032,274 | A | | 2/2000 | Manning .................... 714/718 |
| 6,081,915 | A | | 6/2000 | Kalluri et al. .............. 714/724 |
| 6,122,761 | A | | 9/2000 | Park .......................... 714/724 |
| 6,385,750 | B1 | | 5/2002 | Kapur et al. ................ 714/738 |
| 6,553,530 | B1 | | 4/2003 | Kim ........................... 714/738 |
| 2002/0124217 | A1 | * | 9/2002 | Hiraide et al. ............. 714/726 |
| 2004/0230884 | A1 | * | 11/2004 | Rajski et al. ............... 714/742 |
| 2006/0095818 | A1 | * | 5/2006 | Bratt et al. ................. 714/726 |

FOREIGN PATENT DOCUMENTS

EP           0481097     *    4/1992

OTHER PUBLICATIONS

Swaminathan et al., "On Using Twisted-Ring Counters for Test Set Embedding in BIST", Jul. 16, 2001, Kluwer Academic Publishers, Journal of Electronic Testing, vol. 17 pp. 529-542.*

Chakrabarty et al., "Built-in Self Testing of High Performance Circuits Using Twist-Ring Counters", May 2000, IEEE Circuits and Systems Proceedings, ISCAS 2000, vol. 1 pp. 72-75.*

(Continued)

*Primary Examiner*—Guy Lamarre
*Assistant Examiner*—John P. Trimmings
(74) *Attorney, Agent, or Firm*—Patrick J. Daugherty; Driggs, Hogg & Fry Co., LPA

(57) ABSTRACT

A method and system for built-in self-testing for high-performance circuits, configured to generate and apply a test pattern to a circuit under test (CUT). A logic structure in communication with the CUT and a memory device generates a plurality of test seeds from a plurality of original test seeds, the generated test seeds and original test seeds defining a total test seed plurality and a subset deterministic test pattern plurality. A response suppression circuit suppresses test responses from the CUT if not generated responsive to a deterministic test seed of the deterministic test pattern plurality.

13 Claims, 8 Drawing Sheets

OTHER PUBLICATIONS

Chakrabarty et al., "Efficient Test Response Compression for Multiple-Output Circuits", Oct. 1994, IEEE Test Conference Proceedings, pp. 501-510.*

U.S. Patent Application of Shivakumar Swaminathan entitled "Built-In Self-Test (BIST) for High Performance Circuits", U.S. Appl. No. 10/915,981, filed Aug. 11, 2004.

IBM Technical Disclosure Bulletin vol. 25, No. 1, Jun. 1982, entitled "Data Packer", D. R. Dewar, pp. 265-268.

IBM Technical Disclosure Bulletin vol. 21, No. 7, Dec. 1978, entitled "Dynamic Subsumation of Test Patterns for LSSD Systems", P. Goel, pp. 2782-2784.

Dossier DE919900018, "Method and Apparatus for Testing a VLSI Device", J. Riegler et al, Sep. 15, 1990, pp. 1-9.

"On Using Twisted-Ring Counters for Test Set Embedding in BIST", Shivakumar Swaminathan, Journal of Electronic Testing: Theory and Application, 2001, pp. 529-542.

* cited by examiner

TRC-BIST

TRC-pattern

Finite state machine

METHOD AND APPARATUS TO DISABLE COMPACTION OF TEST RESPONSES IN DETERMINISTIC TEST-SET EMBEDDING-BASED BIST

CROSS REFERENCE TO RELATED APPLICATION

Commonly assigned United States patent application by Shivakumar Swaminathan entitled BUILT-IN SELF-TEST (BIST) FOR HIGH PERFORMANCE CIRCUITS, filed Aug. 11, 2004, Ser. No. 10/915,981, is hereby incorporated by reference.

FIELD OF THE INVENTION

The present invention generally relates to integrated circuits and, more particularly, to a method and system for built-in self-test (BIST) architecture for high-performance circuits.

BACKGROUND OF THE INVENTION

A large number of test patterns must be applied to high-performance circuits in order to detect and diagnose realistic defects. This can be achieved using a test-per-clock built-in self-test (TPC-BIST) 1 architecture illustrated in FIG. 1, in which a test pattern is applied by a test generator circuit (TGC) 2 to the circuit under test (CUT) 4 every clock cycle, and the test response is captured by an appropriate response monitoring circuit 6.

Alternatively, prior art BIST methods may rely on a test-per-scan architecture 11, wherein a TGC 3 serially loads test patterns into a scan chain register 9 in communication with the CUT 5, with test response Output from the scan chain register 9 to the response monitoring circuit 7. In this test-per-scan method, one test pattern is applied to an n-input CUT 5 every n+1 cycles. While test-per-clock BIST architecture 1 methods require less testing time, they introduce mapping logic between input scan register elements in the TGC 2 and the CUT 4. The associated performance degradation makes these methods unsuitable for testing high-performance circuits. For example, in some prior art systems, test-per-clock methods require combinational mapping logic for transforming pseudorandom patterns generated by a linear-feedback shift-register (LFSR) incorporated in the TGC to useful test patterns targeted at hard-to-detect faults.

"Reseeding" techniques are commonly used to generate test seeds by using a starting test pattern "seed" or starting plurality of seeds in a scan chain and looping the initial test pattern(s) through the scan chain to generate more seeds, wherein seeds are pushed through at every test iteration. It is known to apply test-per-clock BIST architecture by reconfiguring the input scan register into a twisted ring counter (TRC), also known as a Johnson counter. The key idea is to employ "reseeding" to embed an entire pre-computed deterministic test set $T_D$ in a slightly longer test sequence that is applied to the CUT. The TRC-based test pattern generator can be designed by adding a multiplexer and an inverter to the serial input of the scan register feeding the CUT. Since no redesign of the CUT is necessary and no additional logic is added to the critical paths beyond that required for scan, this test architecture is especially suitable for high-performance circuits.

TRC-based architecture offers a number of advantages. The test control logic is simple and can result in a lower overhead implementation than that required for LFSRs. In addition, the number of seed bits required is in many cases less than for previously published (LFSR-based) reseeding schemes. And TRC configuration is CUT-independent; it can be employed for testing multiple CUTs by simply changing seeds. In fact, this aspect of the TRC-based architecture can be especially appealing for BIST tool vendors who tend to prefer generic BIST circuits that do not have to be tailored to specific CUTs.

However, there are some disadvantages to TRC-based test architecture. Since the seeds are stored on-chip, it is essential that a very small number of seeds must be sufficient for embedding $T_D$. Unfortunately, the number of seeds required for the test architecture is sometimes too high. And, in particular, the problem of compacting a large number of distinct test responses during deterministic BIST reseeding must be addressed. Deterministic BIST reseeding solutions are gaining importance because they require a small number of seeds to be stored to embed a complete automatic test pattern generation (ATPG) program test set $T_D$ providing complete fault coverage for all detectable stuck at faults. However, a large number of distinct responses in such reseeding approaches result in a large number of outputs for space compaction of these responses.

What is needed is a method to compact only those responses corresponding to patterns which are part of the original test set $T_D$. No existing solutions are available in the prior art which selectively compact responses in deterministic BIST approaches. Selective response compaction in LFSR based reseeding approaches are tougher to implement because the location of deterministic patterns in a pseudo-random sequence cannot be determined in a precise way.

SUMMARY OF THE INVENTION

A method and system for built-in self-testing for high-performance circuits, configured to generate and apply a test pattern to a circuit under test (CUT). A logic structure in communication with the CUT and a memory device generates a plurality of test seeds from a plurality of original test seeds, the generated test seeds and original test seeds defining a total test seed plurality and a subset deterministic test pattern plurality. A response suppression circuit suppresses test responses from the CUT if not generated responsive to a deterministic test seed of the deterministic test pattern plurality.

DESCRIPTION OF EMBODIMENTS OF THE INVENTION

While test set embedding helps to reduce test data volume, it also impacts the size of the space compactor since the space compactor now has to deal with a larger number of distinct fault free responses. What is new in the present invention is a system and method that effectively suppresses extra CUT responses to patterns in reseeding-based pattern applications. Suppressing superfluous responses helps to reduce the number of outputs of a space compactor and thereby reduces test bandwidth and tester cost. In one aspect of the present invention, test-set embedding is used for storing a small number of seeds and compressing only responses of ATPG patterns embedded in a deterministic sequence obtained from those seeds. The present invention uses the test set embedding scheme described in an enhanced TRC-BIST architecture for pattern application.

Figure 1:
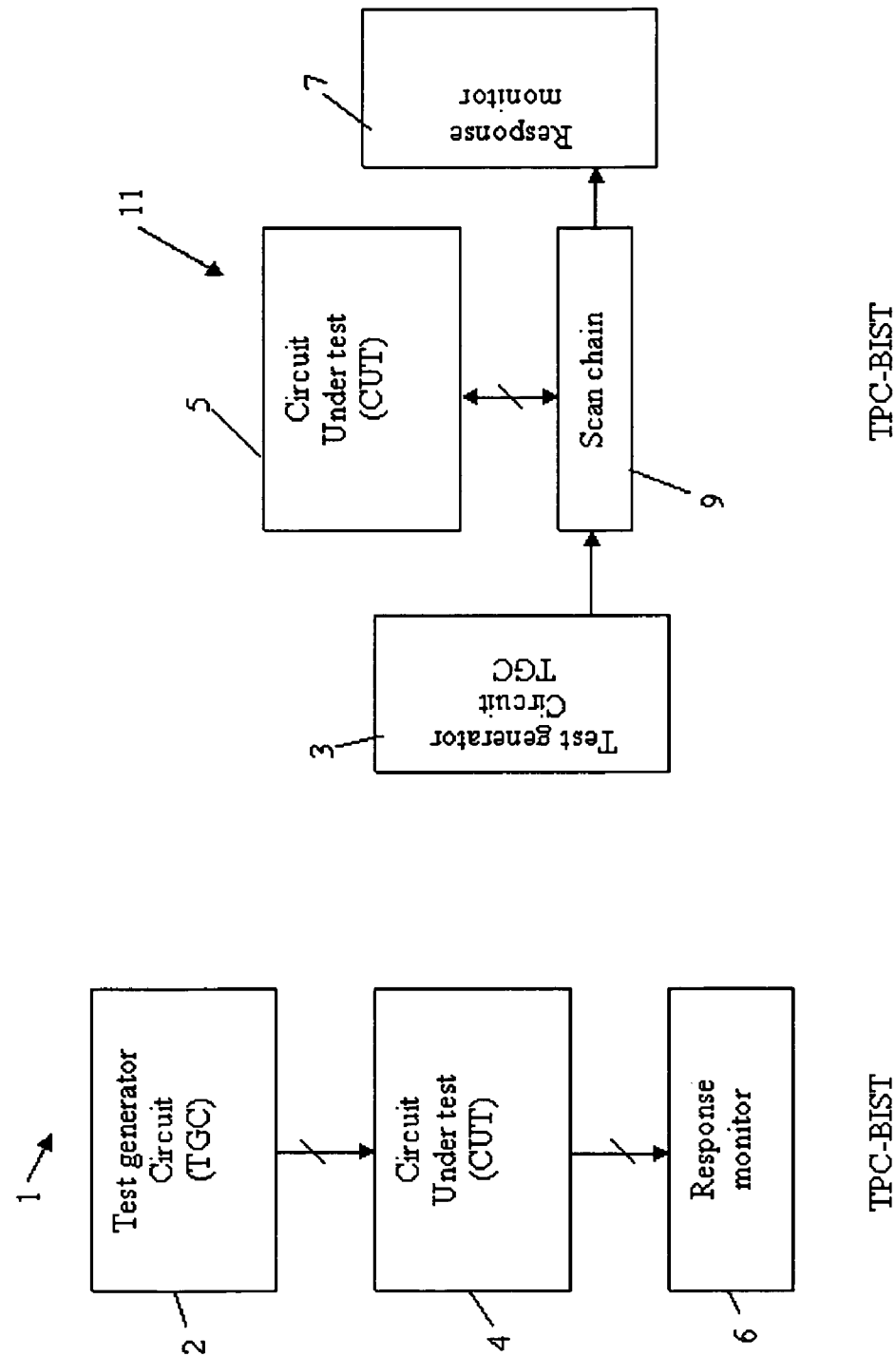
FIG. 1 is a block diagram of a prior art test-per-clock built-in self-test (TPC-BIST) system.
Figure 2:
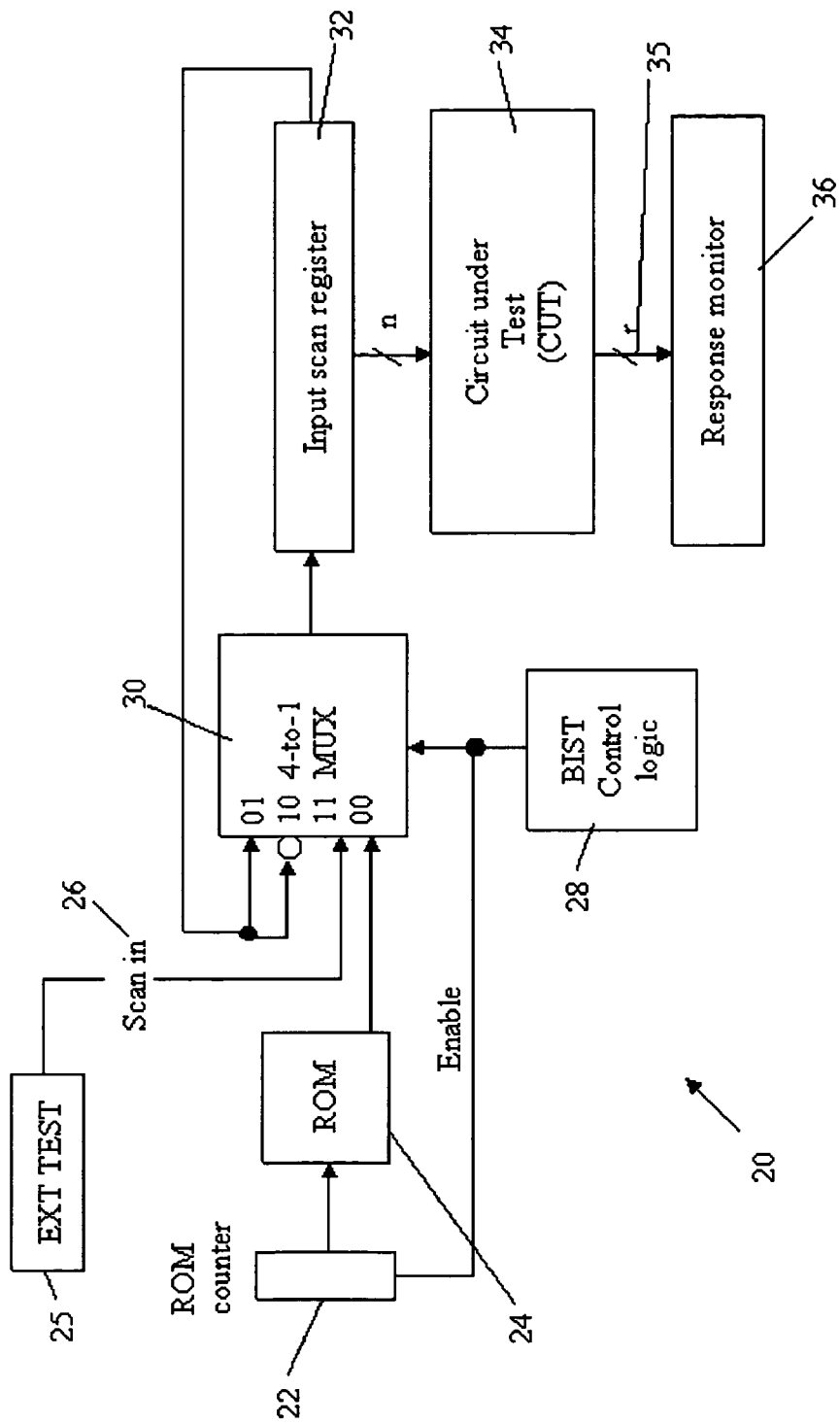
FIG. 2 is a block diagram of a prior art enhanced TRC-BIST pattern generator.

An enhanced TRC-BIST pattern generator architecture 20 appropriate for use with the present invention is illustrated in FIG. 2 and taught in "On Using Twisted-Ring Counters for Test Set Embedding in BIST" by S. Swaminathan and by K. Chakrabarty, *Journal of Electronic Testing: Theory and Application,* 2001, which is hereby incorporated by reference, wherein high-performance circuits are tested by test patterns generated by reseeding in the TRC input scan register 32. A commonly assigned United States patent application by Shivakumar Swaminathan entitled BUILT-IN SELF-TEST (BIST) FOR HIGH PERFORMANCE CIRCUITS, filed Aug. 11, 2004, Ser. No. 10/915,981 ("Swaminathan"), also provides a TRC-BIST pattern generator architecture relevant to the present invention, the disclosure of which is hereby incorporated by reference.

The above-incorporated references teach that a small number of seeds are adequate for generating test sequences that embed complete test sets for ISCAS benchmark circuits, and can either be stored on-chip, for example in a random access memory (ROM) module 24, or scanned in through a "scan in" input 26 using a low-cost, slower tester; each input option is connected to the input scan register 32 through a MUX 30, which also provides BIST control logic 28 input responsive to ROM counter 22 enablement. The seeds can thus be viewed as an encoded version of the test set: during testing, the patterns derived from the seeds are applied test-per-clock to the circuit under test 34. This enables the effective combination of high-quality BIST with external testing using slower testers. CUT 34 responses are outputted to a response monitor 36 through a response monitor input bus 35.

In a TRC, an n-bit ring counter is a group of n flip-flops F1, F2, . . . , Fn connected as a shift register, with the output of Fn fed back to the input of F1. It behaves as a counter with up to n distinct states, depending on the initial value (seed). The TRC is a ring counter with an inverter added between the output of Fn and the input of F1. Depending on the seed, an n-bit TRC behaves as a counter with up to 2n distinct states.

The ROM 24 for storing seeds can be eliminated if an external tester 25 is used to scan in the seed patterns through the "scan in" input 26. The TRC n-bit input register 32 is configured into a length n during testing. The TRC-BIST pattern generator 20 operates in two modes, namely the "shift" and "twist" modes, which correspond to an n-bit ring counter and TRC, respectively.

Figure 3:
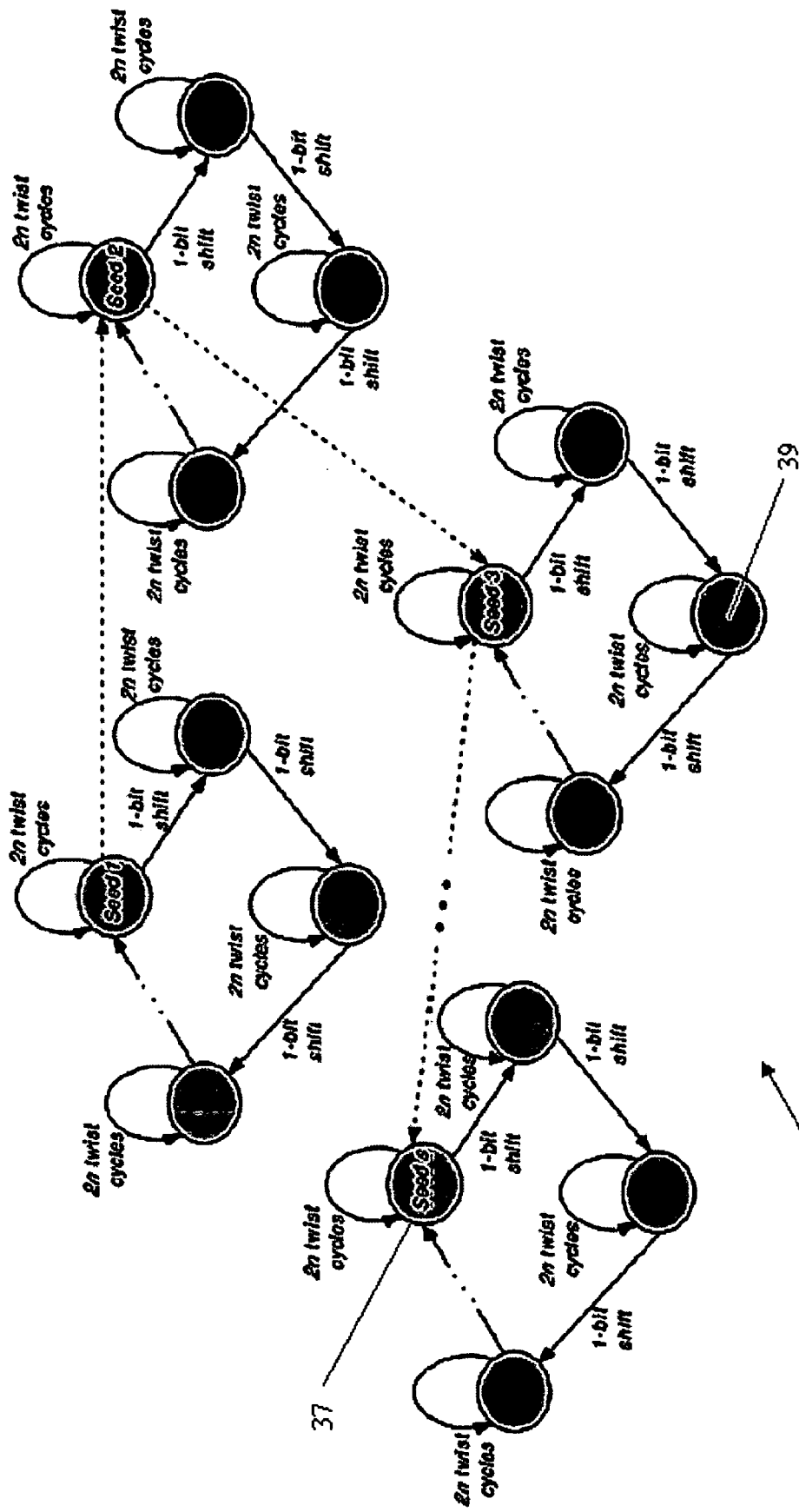
FIG. 3 is a state diagram of a prior art twisted ring counter seed pattern.

A much larger number of patterns can be generated within the input scan register 32 from a given seed by clocking the TRC for $2n^2+n$ cycles. This is shown in FIG. 3 where a total of s seeds 37 are used for test application. The twisted ring counter 39 test control circuit 38 is derived from a simple finite-state machine (FSM) defined within the input scan register 32 with three states—Load, Twist and Shift.

Figure 4:
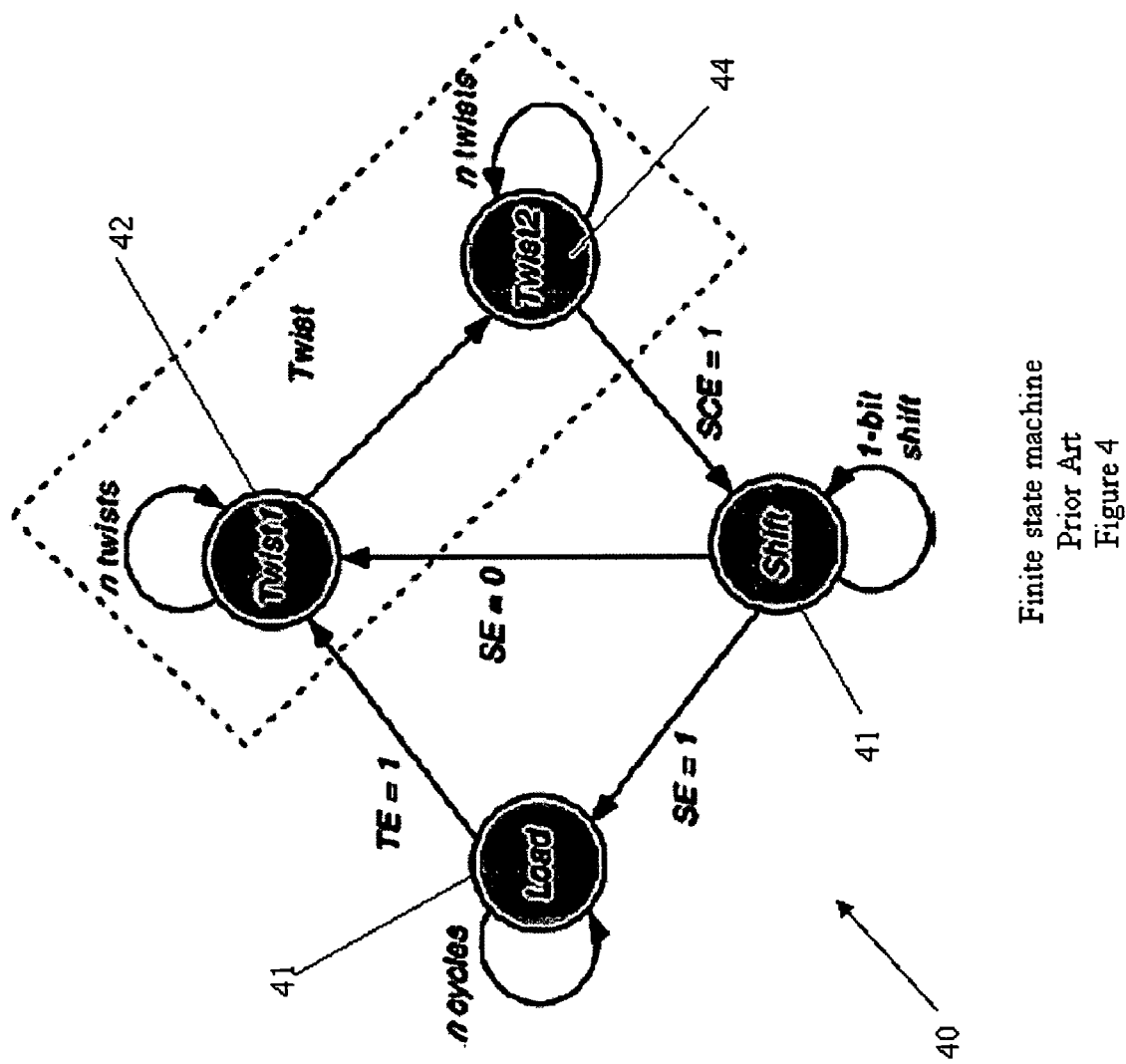
FIG. 4 is a state diagram of a prior art twisted ring counter finite-state machine seed pattern.

The state diagram for a Moore-type FSM 40 is shown in FIG. 4. (The Twist state is depicted in the state diagram as two substates—Twist1 42 and Twist2 44.) Two k-bit counters 41, k=[$\log_2$ n], with enable inputs are required to generate the signals "Twist Enable" (TE) and "Shift Enable" (SE) that feed the test control logic. One of these counters is required in any autonomous scan-based BIST scheme. The control circuit generates a "Shift-Counter Enable" (SCE) signal which enables the shift counter.

The finite-state machine FSM 40 operation is described as follows:

1. The FSM 40 is initially in the Load state (encoded as the 00 binary pattern). The seed pattern is serially loaded into the n-bit input scan register 32 in n clock cycles.

2. At the end of the Load operation, TE goes high and the FSM 40 goes into the Twist state (encoded as two substates corresponding to the binary patterns 01 and 10, respectively). The content of the input scan register 32 undergoes 2n twists in 2n clock cycles. After 2n cycles, the input scan register 32 contains the seed pattern.

3. After 2n twists are completed, SCE goes high, and the FSM 40 goes into the Shift state (encoded as the 11 binary pattern). It remains in this state for only one clock cycle. A 1-bit shift is performed on the content of the input register.

4. The FSM 40 now re-enters the Twist state, and remains in this state for 2n cycles. This process repeats until n shift operations are completed, at which point SE goes high and a new seed is loaded into the input register.

The TRC-BIST 20 uses an Algorithm A for selecting a small set of seeds that generates all the test patterns in $T_D$: "If a pattern $t_k$ lies either on the shift cycle or on the twist cycle of another pattern $t_j$, then |TC ($t_j$)–TC($t_k$)|≦1"; wherein the transition count of a fully-specified pattern $t_j$ is the sum of the number of 1-to-0 and 0-to-1 transitions in $t_j$. If $t_j$ is defined as the vector $b_1 b_2 \ldots b_n$ then the transition count is defined as:

$$TC(t_j) = \sum_{i=1}^{n-1} b_i \oplus b_{i+1}.$$

A pattern $t_j$ is compatible with pattern $t_k$ if there is no bit position in $t_j$ and $t_k$ that are specified and different. For example, 1011X is compatible with X01X0 but is not compatible with 11X1X because of the conflict in the second bit position. Finally, a pattern $t_k$ lies on the shift cycle of pattern $t_j$ if it can be obtained from $t_j$ by performing at most n consecutive shift operations. Similarly, $t_k$ lies on the twist cycle of $t_j$ if it can be obtained from $t_j$ by performing at most 2n consecutive twist operations.

2n shift operations are performed on each of n patterns that are obtained by carrying out shift operations on a seed, as illustrated in FIG. 3. The following Algorithm B, which is based on Algorithm A, provides a necessary condition for two patterns to be derived from the same seed during $2n^2+n$ clock cycles: "If patterns $t_j$ and $t_k$ are derived from a common seed s during the $2n^2+n$ cycles in which s is used for pattern generation, then:

$$|TC(t_j) - TC(t_k)| \leq 3.$$

In order to select the seeds to be used for generating test patterns using a TRC, a heuristic algorithm may determine the seeds in reasonable time. The seed selection procedure is described in pseudocode form in Table 1.

TABLE 1

```
Procedure SelectSeed( )
    /* select a set of seeds to generate test patterns in T_D */
    begin
        k := 1; /*seed index */
        shift_count := 0;
        S := φ; /*initialize seed set */
        s_k := t_1; /* first test pattern chosen as first seed */
        while(all_test_patterns_not_marked)
            while(shift_count ≠ n)
                for(number_of_twists = 1 to 2n)
                    begin
                        twist(s_k);
                        for(j := 1 to m)
                            if compatible(s_k, t_j) and mark(t_j) = 0
                                /* Check whether s_k and t_j are compatible and
                                   t_j not yet covered */
                                break;
                        end for;
                        s_k := assign(t_j);
                        mark(t_j) := 1;
                            /* assign dont cares in s_k appropriately and mark
                               t_j as covered */
                    end for;
                one_bit_shift(s_k); Increment shift_count;
                /* Carry out a 1-bit shift on s_k */
                for(j := 1 to m)
                    if compatible(s_k, t_j) and mark(t_j) = 0
                        break;
                end for;
                s_k := assign(t_j);
                mark(t_j) := 1;
            end while;
            S := S U s_k;
            Increment k;
                /* add s_k to seed set */
            for(j := 1 to m)
                if (mark(t_j = 0))
                    s_k := t_j;
                    break;
                    /* pick next seed s_k */
                end if;
            end for;
        end while;
        return(S);
    end Procedure;
```

The heuristic according to the present invention procedure works as follows. An arbitrary ordering is first imposed on the test patterns in $T_D$. The first (partially-specified) test pattern in the test set $T_D$ is then chosen as the starting seed s. This seed undergoes 2n twists. If a pattern on the twist cycle is compatible with a test pattern in $T_D$, the don't-care bits in the generated pattern (and, therefore, the don't-care bits in s) are appropriately assigned binary values and the corresponding test pattern is marked as "covered." (The objective is to keep as many don't-care bits unassigned as possible since more don't-cares increase the likelihood of covering patterns from $T_D$.) This is followed by a 1-bit shift operation on s, and the process is repeated until all n shift operations are carried out. At the end of n shift operations (complete shift cycle of s), if there are test patterns that are not yet covered, the first "unmarked" (partially-specified) test pattern is chosen as the next seed. The procedure terminates when all patterns in the test set are covered. The worst-case complexity of this procedure is $O(m^2n^2)$.

What is new in the present invention is a synthesis-based approach to selectively suppress test responses. This does not change the number of outputs needed for zero aliasing space compactors. Among the advantages provided by the present invention:

(1) The present invention enables very small hardware overhead for zero aliasing space compactors due to almost same size fault free response set compared to methods which do not use response suppression. The space compactors need at the most one additional output for error propagation.

(2) No CUT modifications are required.

(3) Reduced Tester pin requirements (at most one extra pin) result in reduced test costs and increased efficiencies.

(4) Logic may be shared for test generation and response compaction.

(5) Small overhead for the response suppression logic.

(6) Counter states are used as inputs for RSL design which is easily scalable.

Figure 5:
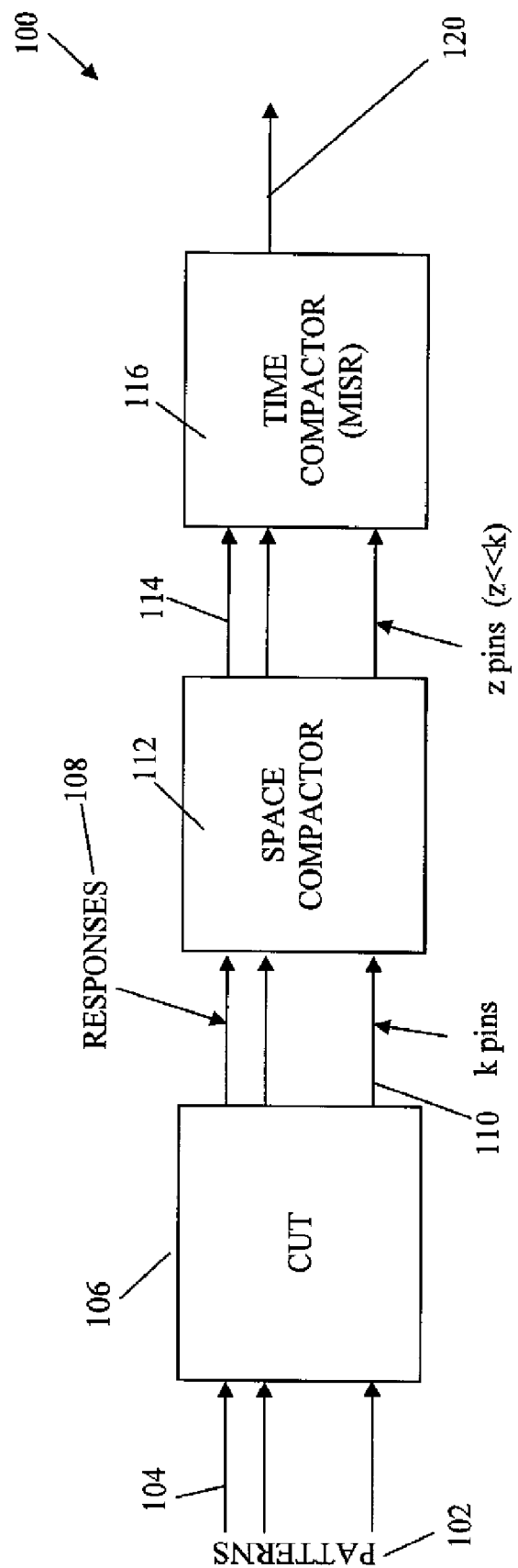
FIG. 5 is a block diagram of a prior art TRC-BIST pattern generator response compaction method.

FIG. 5 shows the general block diagram of a typical prior art response compaction method 100. A space compactor 112 and a time compactor 116 are located in series between the CUT and a response monitor input bus 120. Test patterns 102 are applied to the inputs 104 of the CUT 106, and output responses 108 are then input through k pin connections 110 to the space compactor 112. Compacted responses are then input through z pins 114 to the time compactor 116, which outputs time compacted response to the response monitor input bus 120.

While test set embedding helps to reduce test data volume, it also impacts the size of the space compactor since the space compactor now has to deal with a larger number of distinct fault free responses. According to the present invention, the minimum number of outputs of a zero aliasing space compactor may be determined by the following:

Algorithm 1: Let p be the number of distinct fault free responses to a circuit under the application of the ATPG test set $T_D$. The minimum number of outputs q of a zero aliasing space compactor designed just using the response vectors is given by $q \geq \log(p+1)$.

It follows from Algorithm 1 that if the number of distinct fault free responses increases (very likely due to the long test embedding sequence in BIST reseeding) to a value d, d>p, a larger number of space compactor outputs ($=\log(d+1)$) will have to be monitored. The present invention describes a response suppression method and system which will result in at most one extra space compactor output pin than what is required when only vectors in $T_D$ are applied. Specifically, a second algorithm may be described as follows:

Algorithm 2: Let p be the number of distinct fault free responses to a circuit under the application of $T_D$. The minimum number of outputs (q) of a zero aliasing space compactor designed just using response vectors for an enhanced TRC-BIST architecture twist ring based pattern application scheme is given by:

$$\log(P+1) \leq q \leq \log(P+2).$$

Figure 6:
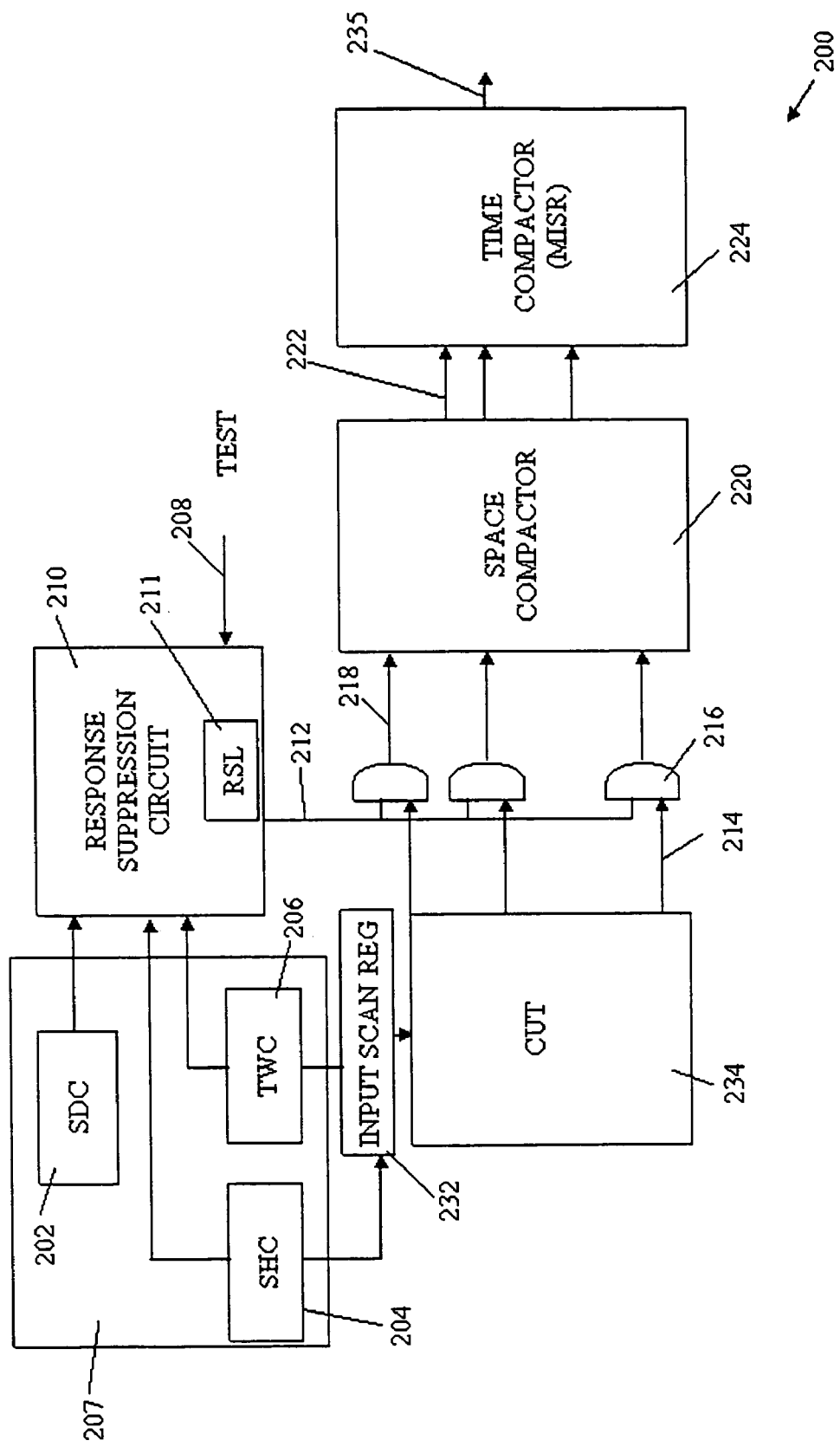
FIG. 6 is a block diagram of a response suppression circuit according to the present invention.

What is novel in the present invention is the design of a response suppression circuit which disables the compaction of test responses to test patterns in a twist ring sequence which is not part of the original ATPG generated test set $T_D$. FIG. 6 is a block diagram of such a novel circuit 200 appropriate for use with a TRC-BIST system 20 of FIG. 2; accordingly, the elements depicted herein as shown may be incorporated between a CUT 234 and a response monitor input bus 235. (Although the present embodiment of the invention will be described with respect to the prior art TRC-BIST system 20 of FIG. 2, it is to understood that the present invention may be incorporated with other deterministic test-set embedding-based BIST systems, and is not restricted to the specific examples and prior art applications provided herein.)

Test responses are correlated with individual deterministic seeds for identification and suppression purposes according to the present invention. Where seeds are generated using a seed selection algorithm, such as, for example, the seed selection algorithm taught by the related patent application to Swaminathan (incorporated above), the location of deterministic patterns which are of interest (i.e. part of $T_D$) from the ATPG test set $T_D$ can be determined by working backwards. Thus, for a two-bit test pattern structure, if T={00, 10, 11} and seed set={00}, then, using the Swaminathan twisted ring method, the deterministic patterns of interest can be determined as illustrated in Table 2 below.

TABLE 2

| SDC | SHC | TWC | RSL output | (Comments) |
|---|---|---|---|---|
| 0 | 00 | 00 | 1 | |
| 0 | 01 | 10 | 1 | |
| 0 | 10 | 11 | 1 | |
| 0 | 11 | 01 | 0 -----------> | not part of T |
| 1 | XX | XX | 0 -----------> | all tests already covered |
| 1 | XX | XX | 0 -----------> | only 1 seed, so output = 0 for SDC = 1 |

According to the present invention, let s be the number of deterministic seeds required to embed $T_D$. Let n be the length of an input scan register 232. The states of a log seed counter (SDC) 202, log n shift counter (SHC) 204 and a log 2n twist counter (TWC) 206 and a test mode bit (TM) 208 are the inputs to the response suppression circuit 210 containing the response suppression logic (RSL) 211, which generates a single output 212. Note that SHC 204 and TWC 206 are shared for pattern application as well. The RSL output 212 is input to a series of AND gates 216 along with the CUT 234 response inputs 214, the RSC output 212 thereby controlling the application of the CUT responses 214 to the inputs 218 of the space compactor 220, and thereby the compacted inputs 222 to the time compactor 224.

In another aspect of the present invention, the counters 41 logic illustrated in FIG. 4 may be shared for test generation and response compaction. Accordingly, the test control logic structure 207 for test generation provided to control testing of the CUT 234 comprises the shift counter 204, seed counter 202 and twist counter 206 structures, thereby enabling sharing of the twist counters and associated logic structures. What is new is that the seed counter 202 and twist counter 206 structures are used for both applying test patterns and for test response compaction. Thus, the present invention provides economies in reducing hardware overhead through the sharing of the logic resources.

Synthesis of RSL: In order to synthesize the RSL 211, we need to determine the exact location of the deterministic patterns of $T_D$ in the twist ring embedding sequence. This can be expressed as a function of the states of SDC 202, SHC 204 and TWC 206 because that is the way the seeds are pre-determined in software.

The information about the precise location of the deterministic patterns for a four-bit test pattern structure can be formulated in Table 3, a state table shown below.

TABLE 3

| SDC | SHC | TWC | RSL output |
|---|---|---|---|
| 0000 | 0000 | 0000 | 1 |
| | | 0001 | 0 |
| | | 0010 | 0 |
| | | 0011 | 1 |
| | | 0100 | 1 |
| | | 0101 | 0 |
| | | 0110 | 1 |
| | | 0111 | 0 |
| | | 1XXX | X |
| 0000 | 0001 | 0000 | 1 |
| | | 1XXX | X |
| 0000 | 1XXX | XXXX | X |
| 1XXX | XXXX | XXXX | X |

A "1" value in the RSL Output column of Table 3 corresponds to the response of the CUT to a deterministic pattern belonging to the test set $T_D$. A "0" value in the RSL Output column corresponds to the response of the CUT to a pattern NOT belonging to $T_D$. An "X" value in the RSL Output column implies that we will never reach the corresponding states of SDC 202, SHC 204 and TWC 206.

What is important in the present invention is that even where a large number of test cells are utilized, in the scale of thousands, due to the logarithmic characteristics of the component structures according to the present invention, only a small number of test inputs and outputs are required. The Table 3 state table can be synthesized using logic synthesis tools to generate a circuit from the invention embodiment component structure (log s SDC 202, log n SHC 204 and log 2n TWC 206 and TM 208), thus log s+log n+log 2n inputs+one output.

Figure 7:
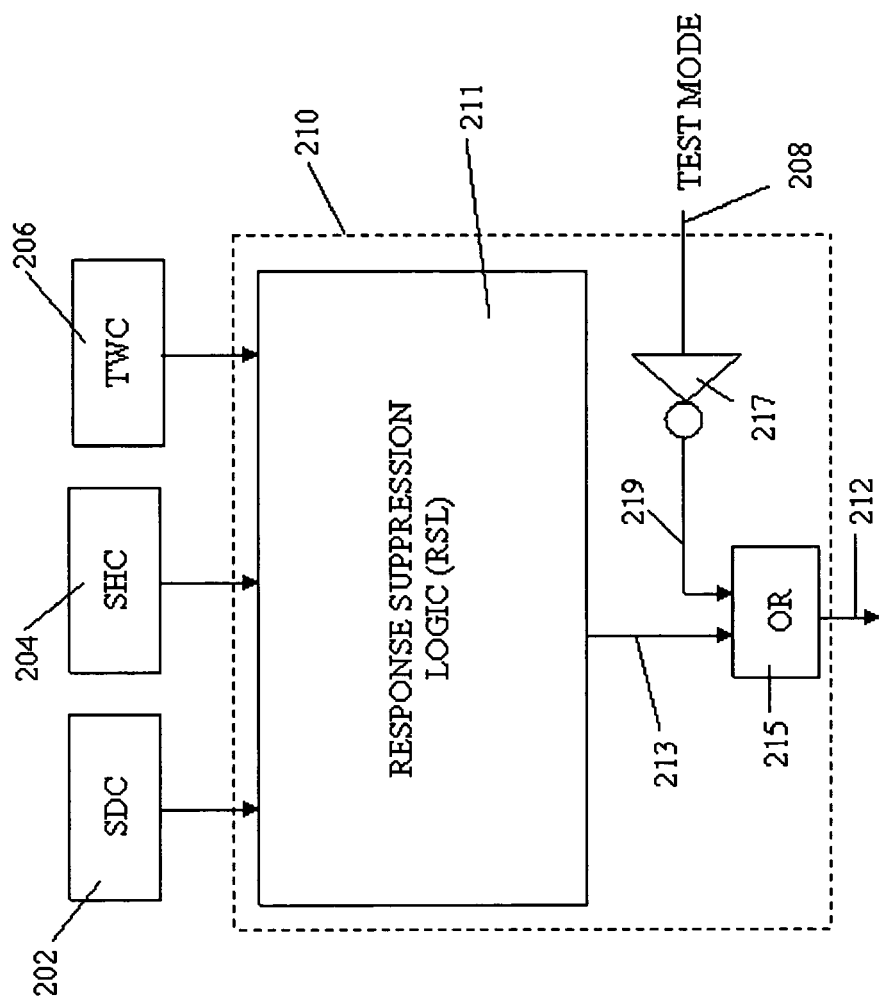
FIG. 7 is a detail view diagram of the response suppression circuit of FIG. 6.
Figure 8:
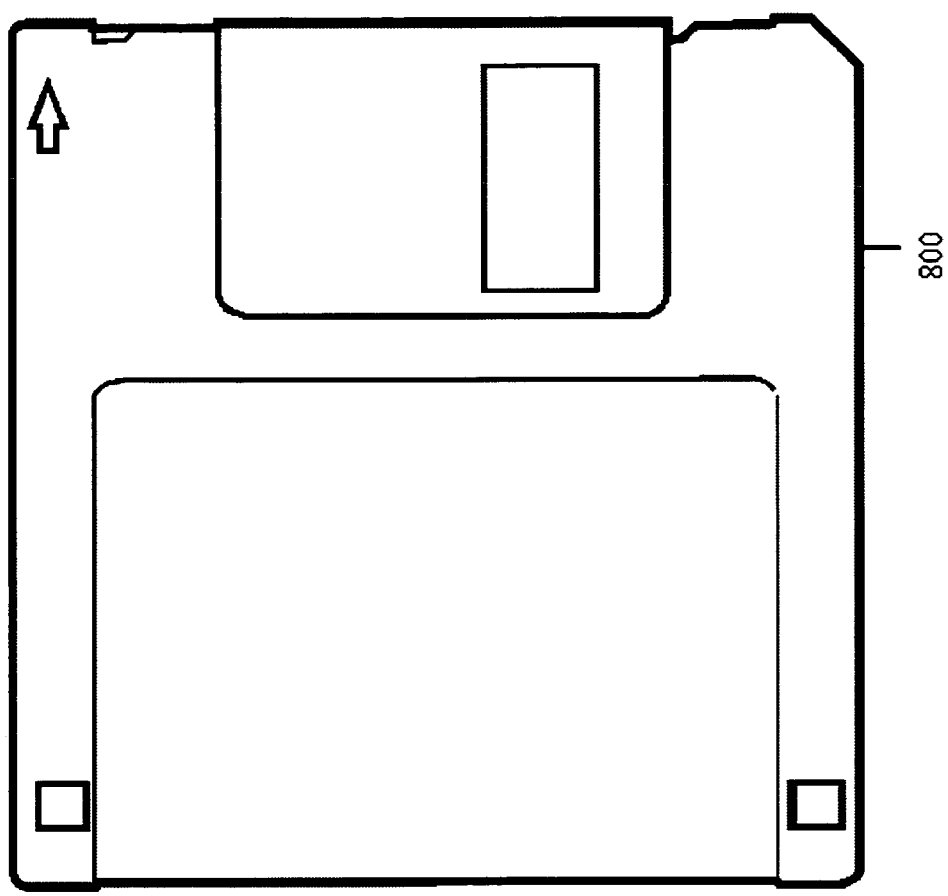
FIG. 8 is an article of manufacture comprising a computer usable medium having a computer readable program according to the present invention embodied in said medium.

FIG. 7 provides a detail view of the response suppression circuit 210. The RSL 211 output 213 is input to an OR gate 215. The test mode bit 208 enters an inverter 217, and the inverted output 219 is combined with the RSL 211 output 213 at the OR gate 215, which generates the response suppression circuit 210 output 212. As is readily apparent, the inverter 217/OR gate 215 structure functions to enable the RSL 211 only when test mode is indicated by a test mode 208 bit value of 1. If instead the circuit is in a functional mode, the test mode 208 bit value is 0 and RSL 211 response suppression is disabled.

Scan chains found in common benchmark test architecture include those 61 or 100 cells in length, wherein multiples of chains are typically run: for example, 32 chains at 61 cells each results in a number n of test inputs of 1,952. For single chain test, 2000 cells may be provided, or n=2000. Where n=2000, using the enhanced TRC-BIST architecture method described above to determine the requisite number of seeds required, s results in s=10. And, therefore, according to the present invention, a number of test mode inputs for the RSL 211 is =log s+log 2n+log n+1=log 10+log 4000+log 2000+1=4+12+11+=28. Thus,the resultant RSL 211 is basically a combinational circuit with 28 inputs and 1 output.

In one embodiment of the present invention, a superset (order $n^2$) of $T_D$ is applied to the CUT 207 using s seeds. For example, in order to embed $T_D$=10,000 patterns, 2*(1464) *(1464)+1464 vectors are applied, where n=1464 is the length of a scan chain in the benchmark (s)38584 using s=22 seeds. Hence, there are a large number of responses to vectors not part of $T_D$. Suppressing these responses helps to reduce the number of outputs of the space compactor and thereby reduces test bandwidth and tester cost.

The inventions described above may be tangibly embodied in a computer program residing on a computer-readable medium or carrier 800. The medium 800 may comprise one or more of a fixed and/or removable data storage device, such as a floppy disk or a CD-ROM, or it may consist of some other type of data storage or data communications device. The computer program may be loaded into a memory device in communication with a network processor for execution. The computer program comprises instructions which, when read and executed by the processor, causes the processor to perform the steps necessary to execute the steps or elements of the present invention.

While embodiments of the invention have been described herein, variations in the design may be made, and such variations may be apparent to those skilled in the art of computer architecture, systems and methods, as well as to those skilled in other arts. The present invention is by no means limited to the specific programming language and exemplary programming commands illustrated above, and other software and hardware implementations will be readily apparent to one skilled in the art. The scope of the invention, therefore, is only to be limited by the following claims.

What is claimed is:

1. A method for built-in self-testing for high-performance circuits, configured to generate and apply a test pattern to a circuit under test, comprising the steps of:

providing a memory device comprising a quantity value s of original test seeds;

providing a logic structure in communication with the circuit-under-test and the memory device through a first communication link, the logic structure comprising a $\log_2 s$ bit seed counter, a $\log_2 2n$ bit twist counter and a $\log_2 n$ bit shift counter, wherein the twist counter and the shift counter are in communication with a first communication link input scan register having a length n;

the logic structure seed counter and twist counter using a seed generation algorithm to produce generated test seeds from the original test seeds by applying test patterns;

the input scan register loading a total test seed plurality comprising the generated test seeds and the original test seeds into the circuit-under-test;

the circuit-under-test generating a totality test seed response plurality in response to an input of the total test seed plurality, one test seed response for each test seed;

a response suppression circuit in communication with the circuit-under-test and the logic structure through the first communication link and comprising a logic component having a number of inputs $x = \log_2 s + \log_2 2n + \log_2 n + 1$ and a test mode bit input using the logic structure twist counter and shift counter to perform the steps of:

generating a deterministic test pattern subset of the generated test seeds by looping the original test seeds through the input scan register;

identifying each totality test seed response plurality response generated in response to a deterministic test pattern subset test seed; and disabling each totality test seed response plurality response not identified in the identifying step; and a second communication link compactor in communication with the response suppression circuit compacting the identified test seed responses to generate compacted test responses to a response monitor.

2. The built-in self-test method of claim 1, wherein the seed generation algorithm comprises the following steps:

imposing an arbitrary ordering on the deterministic test pattern subset;

choosing a first starting seed for the deterministic test pattern subset;

the logic structure performing 2n twists on the first starting seed;

if an original test seed on a logic twist cycle is compatible with a deterministic test pattern subset seed, then marking a responsively generated test response as covered;

performing a 1-bit shift operation on the original test seeds;

repeating the last five steps of imposing, choosing, performing 2n twists, marking and performing the 1 bit shift operation until n shift operations are carried out;

if there are original test seeds not marked covered, then choosing a first unmarked original test seed as a second starting seed and repeating the last six steps of imposing, choosing, performing 2n twists, marking, performing the 1-bit shift operation and repeating said steps with the second starting seed; and terminating the algorithm when all test seeds are marked covered.

3. The built-in self-test method of claim 1, further comprising the steps of:

the second communication link providing a bus structure in communication with the circuit-under-test, the space compactor and the response suppression circuit;

the bus structure receiving the test seed responses from the circuit-under-test;

the bus structure receiving test suppression data from the response suppression circuit; and the bus structure arbitrating and thereby passing each of the identified test seed responses from the circuit-under-test to the space compactor responsive to the response suppression circuit test suppression data.

4. The built-in self-test method of claim 3, wherein the bus structure is a plurality of gates, the space compactor connected to an output of each of the plurality of gates.

5. The built-in self-test method of claim 4, wherein the memory structure is a buffer structure within the input scan register or an external ROM.

6. A built-in self-test test generator circuit for high-performance circuits, configured to generate and apply a test pattern circuit-under-test, comprising:

a memory device comprising a quantity value s of original test seeds;

a logic structure in communication with the circuit-under-test and the memory device through a first communication link comprising a $\log_2 s$ bit seed counter, a $\log_2 2n$ bit twist counter and a $\log_2 n$ bit shift counter, wherein the twist counter and the shift counter are in communication with a first communication link input scan register having a length n, and wherein the seed counter and the twist counter are configured to apply seed generation algorithm test patterns to produce generated test seeds from the original test seeds wherein the input scan register is configured to load a total test seed plurality comprising the generated test seeds and the original test seeds into the circuit-under-test, and wherein the circuit-under-test is configured to generate test seed responses in response to an input of the total test seed plurality, one test seed response for each test seed;

a response suppression circuit in communication with the circuit-under-test and the logic structure through the first communication link and comprising a logic component having a number of inputs $x=\log_2 s+\log_2 2n+\log_2 n+1$ and a test mode bit input, wherein the response suppression circuit is configured to use the logic structure twist counter and shift counter to generate a deterministic test pattern subset of the generated test seeds by looping the original test seeds through the input scan register, identify each totality test seed response plurality response generated in response to a deterministic test pattern subset test seed, and disable each totality test seed response plurality response not identified; and a second communication link, compactor in communication with the response suppression circuit and configured to compact the identified test seed responses to generate compacted test responses to a response monitor.

7. The built-in self-test test generator circuit of claim 6, wherein the seed generation algorithm comprises the following procedure steps:

imposing an arbitrary ordering on the deterministic test pattern subset;

choosing a first starting seed for the deterministic test pattern plurality;

the logic structure performing 2n twists on the first starting seed;

if an original test seed on a logic twist cycle is compatible with a deterministic test pattern subset seed, then marking a responsively generated test response as covered;

performing a 1-bit shift operation on the original test seeds;

repeating the last five steps of imposing, choosing, performing 2n twists, marking and performing the 1-bit shift operation until n shift operations are carried out;

if there are original test seeds not marked covered, then choosing a first unmarked original test seed as a second starting seed and repeating the last six steps of imposing choosing, performing 2n twists, marking, performing the 1-bit shift operation and repeating said steps with the second starting seed; and terminating the algorithm when all test seeds are marked covered.

8. The built-in self test test generator circuit of claim 6, the second communication link further comprising a bus structure in communication with the circuit-under-test and configured to receive the test seed responses from the circuit-under-test;

the bus structure in communication with the response suppression circuit and configured to receive test suppression data from the response suppression circuit; and the bus structure in communication with the space compactor;

wherein the bus structure is configured to arbitrate and thereby pass each of the identified test seed responses from the circuit-under-test to the space compactor responsive to the response suppression circuit test suppression data.

9. The built-in self-test test generator circuit of claim 8, wherein the bus structure is a plurality of gates, the space compactor connected to an output of each of the plurality of gates.

10. The built-in self-test test generator circuit of claim 9, wherein the memory structure is a buffer structure within the input scan register or an external ROM.

11. An article of manufacture comprising a computer readable medium having a computer readable program embodied in said medium, wherein the computer readable program, when executed on a computer logic structure in communication with a circuit-under-test and a memory device comprising a quantity value s of original test seeds through a first communication link, the logic structure comprising a $\log_2 s$ bit seed counter, a $\log_2 2n$ bit twist counter and a $\log_2 n$ bit shift counter, the twist counter and the shift counter in communication with a first communication link input scan register having a length n, the computer logic structure to generate and apply a test pattern to a circuit-under-test by causing:

the logic structure seed counter and twist counter using a seed generation algorithm to produce generated test seeds from the original test seeds by applying test patterns;

the input scan register loading a total test seed plurality comprising the generated test seeds and the original test seeds into the circuit-under-test wherein the circuit-under-test is configured to generate a totality test seed response plurality in response to an input of the total test seed plurality, one test seed response for each test seed;

a response suppression circuit in communication with the circuit-under-test and the logic structure through the first communication link and comprising a logic component having a number of inputs $x=\log_2 s+\log_2 2n+\log_2 n+1$ and a test mode bit input using the logic structure twist counter and shift counter to:

generate a deterministic test pattern subset of the generated test seeds by looping the original test seeds through the input scan register;

identify each totality test seed response plurality response generated in response to a deterministic test pattern subset test seed; and disable each totality test seed response plurality response not identified; and a second communication link compactor in communication with the response suppression circuit compacting the identified test seed responses to generate compacted test responses to a response monitor.

12. The article of manufacture of claim 11, wherein the seed generation algorithm comprises the following steps:

imposing an arbitrary ordering on the deterministic test pattern subset;

choosing a first starting seed for the deterministic test pattern subset;

the logic structure performing 2n twists on the first starting seed;

if an original test seed on a logic twist cycle is compatible with a deterministic test pattern subset seed, then marking a responsively generated test response as covered;

performing a 1-bit shift operation on the original test seeds;

repeating the last five steps of imposing, choosing, performing 2n twists, marking and performing the 1-bit shift operation until n shift operations are carried out; and if there are original test seeds not marked covered, then choosing a first unmarked original test seed as a second starting seed and repeating the last six steps of imposing, choosing, performing 2n twists, marking, performing the 1-bit shift operation and repeating said steps with the second starting seed; and terminating the process when all test seeds are marked covered.

13. The article of manufacture of claim 12, wherein the computer readable program, when executed on the computer logic structure, further causes a second communication link bus structure in communication with the circuit-under-test, the space compactor and the response suppression circuit to
- receive the identified test seed responses from the circuit-under-test;
- receive test suppression data from the response suppression circuit; and
- arbitrate and thereby pass each of the identified test seed responses from the circuit-under-test to the space compactor responsive to the response suppression circuit test suppression data.

* * * * *